US012532692B2

(12) United States Patent
Wen et al.

(10) Patent No.: US 12,532,692 B2
(45) Date of Patent: Jan. 20, 2026

(54) SEMICONDUCTOR PROCESSING DEVICE

(71) Applicant: HUAYING RESEARCH CO., LTD, Wuxi (CN)

(72) Inventors: Sophia Wen, Wuxi (CN); Zhikai Wang, Wuxi (CN)

(73) Assignee: HUAYING RESEARCH CO., LTD, Wuxi (CN)

( * ) Notice: Subject to any disclaimer, the term of this patent is extended or adjusted under 35 U.S.C. 154(b) by 433 days.

(21) Appl. No.: 17/265,251

(22) PCT Filed: Aug. 16, 2019

(86) PCT No.: PCT/CN2019/101143
§ 371 (c)(1),
(2) Date: Feb. 2, 2021

(87) PCT Pub. No.: WO2020/048306
PCT Pub. Date: Mar. 12, 2020

(65) Prior Publication Data
US 2021/0305068 A1    Sep. 30, 2021

(30) Foreign Application Priority Data

Sep. 7, 2018  (CN) .......................... 201811040519.7
Sep. 7, 2018  (CN) .......................... 201811040534.1

(51) Int. Cl.
H01L 21/67   (2006.01)
B08B 7/00    (2006.01)
H01L 21/02   (2006.01)

(52) U.S. Cl.
CPC ...... H01L 21/67034 (2013.01); B08B 7/0035 (2013.01); H01L 21/02087 (2013.01)

(58) Field of Classification Search
CPC ................................................ H01L 21/67034
See application file for complete search history.

(56) References Cited

U.S. PATENT DOCUMENTS 6,001,182 A * 12/1999 Page ................. H01L 21/67754
118/725
6,004,631 A * 12/1999 Mori ................. H01J 37/32366
438/743

(Continued)

FOREIGN PATENT DOCUMENTS

CN       103367197 A      10/2013
CN     2015108361430      * 1/2016    ............. H01L 21/67

(Continued)

OTHER PUBLICATIONS

International Search Report and Written Opinion of International Application No. PCT/CN2019/101143 mailed on Nov. 1, 2019, 11 Pages including 3 pages of English Translation.

(Continued)

Primary Examiner — Keath T Chen
(74) Attorney, Agent, or Firm — Zhong Law, LLC

(57) ABSTRACT

A semiconductor processing device, comprising: a first chamber; a second chamber movable with respect to the first chamber portion between an open position and a closed position, a micro-chamber being formed between the first chamber portion and the second chamber portion when the second chamber portion is in the closed position with respect to the first chamber portion. The first chamber portion has a first channel formed on an inner wall surface of the first chamber portion facing the micro-chamber. The second chamber portion has a second channel formed on an inner wall surface of the second chamber portion facing the micro-chamber. When the second chamber portion is in the closed position with respect to the first chamber portion and a semiconductor wafer is accommodated in the micro-chamber, the first channel and the second channel communicate with each other and form an edge micro-processing space together, such that the outer edge of the semiconductor wafer accommodated in the micro-chamber extends into the (Continued)

edge micro-processing space. The edge micro-processing space is able to realize processing of the outer edge of the semiconductor wafer.

4 Claims, 10 Drawing Sheets

(56) References Cited

U.S. PATENT DOCUMENTS

| | | | |
|---|---|---|---|
| 6,461,155 B1 | 10/2002 | Settles | |
| 2002/0029978 A1* | 3/2002 | Talieh | C25D 17/001 |
| | | | 205/460 |
| 2002/0062848 A1* | 5/2002 | Luscher | B08B 3/04 |
| | | | 134/36 |
| 2004/0253747 A1 | 12/2004 | Wen | |
| 2009/0241998 A1 | 10/2009 | Kesil et al. | |
| 2011/0146901 A1* | 6/2011 | Hermanowski | H01L 21/67748 |
| | | | 156/499 |
| 2018/0114707 A1 | 4/2018 | Lim et al. | |
| 2018/0350635 A1* | 12/2018 | Wen | H01L 21/67 |
| 2019/0035644 A1* | 1/2019 | Wen | H01L 21/02 |
| 2019/0071212 A1* | 3/2019 | Wen | B65D 11/22 |

FOREIGN PATENT DOCUMENTS

| | | | | |
|---|---|---|---|---|
| CN | 2015108289298 | * | 4/2016 | H01L 21/67 |
| CN | 106783669 A | | 5/2017 | |
| CN | 106803477 A | | 6/2017 | |
| CN | 107845586 A | | 3/2018 | |
| CN | 109119366 A | | 1/2019 | |
| CN | 109166814 A | | 1/2019 | |
| CN | 208706594 U | | 4/2019 | |
| CN | 208738186 U | | 4/2019 | |

OTHER PUBLICATIONS

International Search Report and Written Opinion received for International Patent Application No. PCT/CN2019/101143 mailed on Nov. 1, 2019, 16 Pages including English translation.
First Office Action received for Chinese Patent Application No. 201811040519.7, mailed on Aug. 1, 2023, 9 Pages including english translation.
First Office Action received for Chinese Patent Application No. 201811040534.1, mailed on Aug. 2, 2023, 9 Pages including english translation.
European Search Report received for EP Application No. No. PCT/CN2019/101143 mailed on Sep. 10, 2021, 8 Pages.

* cited by examiner

SEMICONDUCTOR PROCESSING DEVICE

CROSS REFERENCE TO RELATED APPLICATION

This application claims the benefit of International Application No. PCT/CN2019/101143, which was granted an International filing date of Aug. 16, 2019, which in turns claims the priority benefit of China Patent Application No. 201811040519.7 filed on Sep. 7, 2018 and China Patent Application No. 201811040534.1 filed on Sep. 7, 2018. The above-identified patent applications are hereby incorporated by reference in their entirety.

FIELD OF THE INVENTION

The present disclosure generally relates to a surface processing field of semiconductor wafer or similar workpiece, more particularly, to a semiconductor processing device.

BACKGROUND

Each of Chinese patent applications 201210171681.9 and 201210088237.0 discloses a micro chamber processing device for processing a semiconductor wafer. The micro chamber processing device includes a first chamber portion and a second chamber portion. Driven by a driving device, the first and second chamber portions may relatively move between an open position for loading and/or unloading the semiconductor wafer, and a closed position for accommodating and processing the semiconductor wafer. A micro chamber is formed when the first and second chamber portions are disposed in the closed position, and the semiconductor wafer is placed in the micro chamber. Either or both of the first and second chamber portions may include one or more inlets, via which processing fluid may enter the micro chamber, and one or more outlets, via which the processing fluid may exit the micro chamber. During the processing, the semiconductor wafer is entirely exposed in the processing fluid filled with the whole micro chamber. Therefore, the micro chamber processing device is only suitable for the overall processing of semiconductor wafers.

However, in some special semiconductor device processes, only the outer edge of the semiconductor wafer needs to be respectively processed without affecting other parts of the semiconductor wafer.

For example, in the production process of a semiconductor device, the thin layer on the outer edge of the semiconductor wafer needs to be etched and removed without destroying the thin layers of other parts. The process will be described below with reference to the drawings.

Refer to FIGS. 1a to 1d, in which: FIG. 1a is a schematic diagram of a semiconductor wafer 400; FIG. 1b illustrates a sectional view along sectional line A-A of FIG. 1a: FIG. 1c is a sectional view of the outer edge of a semiconductor wafer before outer edge processing: FIG. 1d is a sectional view of the outer edge of a semiconductor wafer after outer edge processing. As shown in FIGS. 1a to 1d, the semiconductor wafer 400 includes a substrate layer 401 and a thin layer 402 deposited on the first side surface and the second side surface of the substrate layer 401. After the etching process on the outer portion of the semiconductor wafer 400, the thin layer 402 of the outer portion of the semiconductor wafer 400 is removed, and the first side surface and the second side surface of the substrate layer 401 are exposed. At present, in order to achieve targeted etching on the outer edge of semiconductor wafers, a dry process is generally adopted, in which the plasma generator is targeted at the outer edge of semiconductor wafers for precise bombardment to remove the thin layer of the outer edge. However, the dry process is costly and complicated.

Therefore, it is necessary to modify the micro-chamber processing device in the existing technology to develop a new type of semiconductor processing device that can realize the targeted processing on the outer edge of the semiconductor wafer.

SUMMARY OF THE INVENTION

A purpose of the present disclosure is to provide a semiconductor processing device that can achieve targeted processing of the outer edge of a semiconductor wafer.

In order to realize the aforementioned purpose, a semiconductor processing device is provided as an embodiment according to the first aspect of the present disclosure. The semiconductor processing device includes a first chamber portion, as well as a second chamber portion that is movable relative to the first chamber portion between an open position and a closed position. When the second chamber portion is in the closed position relative to the first chamber portion, a micro chamber is formed between the first chamber portion and the second chamber portion, one or more stacked semiconductor wafers can be accommodated in the micro chamber, and when the second chamber portion is in the open position relative to the first chamber portion, the semiconductor wafer can be transferred into or out of the micro chamber: wherein the first chamber portion comprises a first channel formed on an internal surface of the first chamber portion facing the micro chamber, and the second chamber portion comprises a second channel formed on an internal surface of the second chamber portion facing the micro chamber, when the second chamber portion is in the closed position relative to the first chamber portion and the micro chamber contains a semiconductor wafer, the first channel and the second channel are connected and together form an edge micro-processing space, which accommodates the outer edge of the semiconductor wafer in the micro chamber into the edge micro-processing space, which is communicated with the outside through the edge processing through-hole, the fluid flows in or out of the edge micro processing space through the edge processing through-hole.

Different from existing techniques, the present disclosure proposes a first channel connecting with a second channel on the internal surface of the first and the second chamber portion, with the help of the barrier of the semiconductor wafer, the first channel and the second channel form a closed outer edge micro-processing space. While the processing fluid flows in the outer edge micro-processing space, a targeted processing is realized on the outer edge of the semiconductor wafer.

According to another aspect of the present disclosure, a semiconductor processing device is provided as another embodiment, which comprises a first chamber portion; and a second chamber portion movable relative to the first chamber portion between an open position and a closed position, wherein when the second chamber portion is in the closed position relative to the first chamber portion, a micro chamber is formed between the first chamber portion and the second chamber, one or more stacked semiconductor wafers can be accommodated in the micro chamber, and when the second chamber portion is in the open position relative to the first chamber portion, the semiconductor wafer can be transferred into or out of the micro chamber: the first chamber portion has an internal surface facing the micro chamber, as well as the second chamber portion has an internal surface facing the micro chamber, when the second chamber portion is in the closed position relative to the first chamber portion and the semiconductor wafer is housed in the micro chamber, the internal side surface of the first chamber portion at least abuts on an edge portion of the first side surface of the semiconductor wafer close to the first chamber portion, while the internal side surface of the second chamber portion at least abuts on an edge portion of the second side surface of the semiconductor wafer close to the second chamber portion, an outer edge surface micro-processing space located outside the semiconductor wafer is formed between the internal surface of the first chamber portion and the internal surface of the second chamber portion, and the outer edge surface micro-processing space connects to the outside via the outer edge surface processing-holes, and fluid flows in or out of outer edge surface micro-processing space through the outer edge surface processing-hole.

Different from existing techniques, the present disclosure proposes a method of a sealed outer edge micro-processing space is formed with the help of the barrier of the semiconductor wafer. While the processing fluid flows in the outer edge micro-processing space, a targeted processing is realized on the outer edge of the semiconductor wafer.

BRIEF DESCRIPTION OF THE DRAWINGS

The present disclosure may be better understood by referring to the drawings as well as the detailed description below. In particular, same numerals are used to refer to same structural parts throughout the drawings.

FIG. 1b illustrates a sectional view along sectional line A-A of FIG. 1a:

FIG. 2b illustrates a zoom-in view of circle A of FIG. 2a:

FIG. 2c illustrates a zoom-in view of circle B of FIG. 2a:

FIG. 3b illustrates a zoom-in view of circle C of FIG. 3a:

FIG. 3c illustrates a zoom-in view of circle D of FIG. 3a:

FIG. 5b illustrates a zoom-in view of circle E of FIG. 5a:

FIG. 6b illustrates a zoom-in view of circle I of FIG. 6a:

DETAILED DESCRIPTION OF THE EMBODIMENTS

To make the above objects, features and advantages of the present disclosure more obvious and easier to understand, the present disclosure is further described in detail below using various embodiments.

Reference herein to "one embodiment" or "an embodiment" means that a particular feature, structure, or characteristic described in connection with the embodiment can be comprised in at least one embodiment of the present disclosure. The appearances of the phrase "in one embodiment" in various places in the specification are not necessarily all referring to the same embodiment, nor are separate or alternative embodiments mutually exclusive of other embodiments. Reference herein to "a plurality of" and "a number of" indicates a quantity of two or more. Reference herein to "and/or" means "and" or "or".

The First Embodiment

Figure 2A:
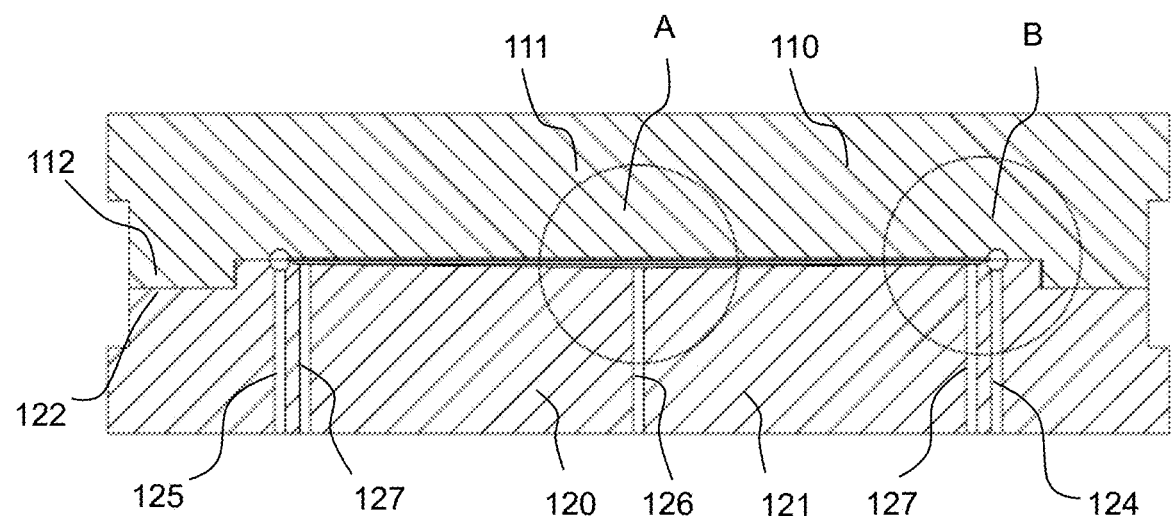
FIG. 2a is a sectional view of a semiconductor processing device according to the first embodiment of the present disclosure.
Figure 2B:
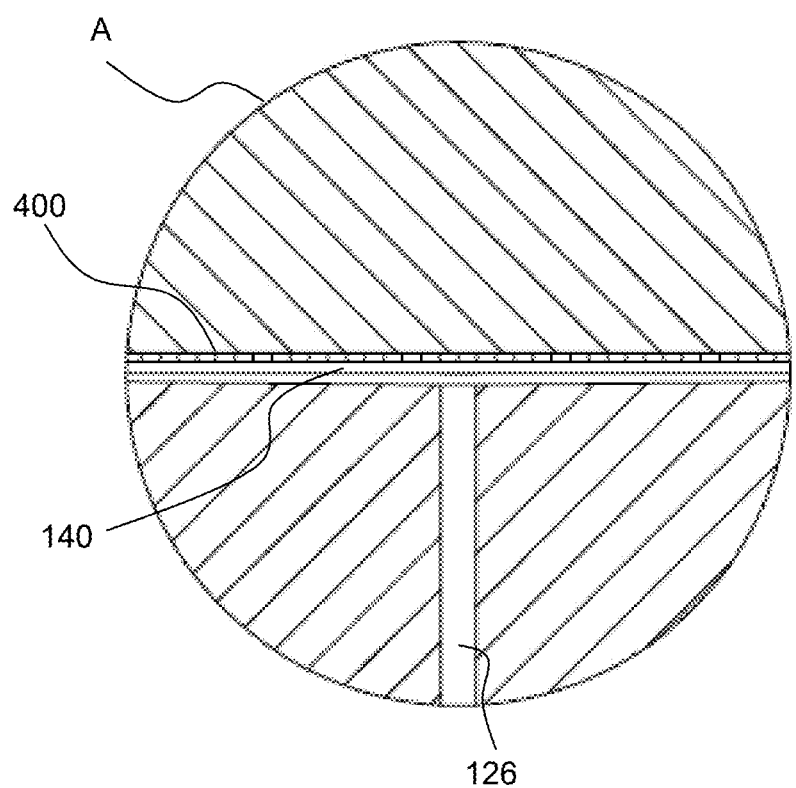
Figure 2C:
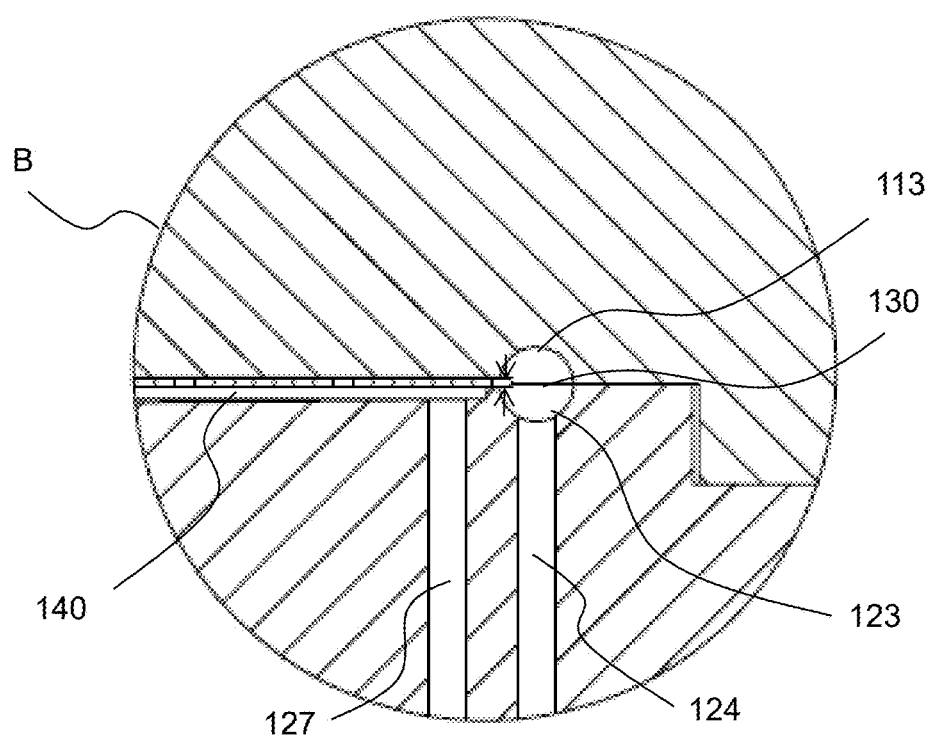

FIGS. 2a to 2c show schematic diagrams of a semiconductor processing device 100 according to the first embodiment of the present disclosure, in which: FIG. 2a is a schematic view of a semiconductor processing device 100; FIG. 2b illustrates a zoom-in view of circle A of FIG. 2a; FIG. 2c illustrates a zoom-in view of circle B of FIG. 2a.

As illustrated in FIGS. 2a to 2c, the semiconductor processing device 100 includes a first chamber portion 110 and a second chamber portion 120. The first chamber portion 110 includes a first chamber board 111 and a protruding edge 112 that extends downward from a circumferential region of the first chamber board 111. The second chamber portion 120 may include a second chamber board 121 and an indentation 122 that indents downward at a circumferential region of the second chamber board 121.

The first chamber portion 110 may be movable relative to the second chamber portion 120 between an open position and a closed position. When the first chamber portion 110 is in the closed position relative to the second chamber portion 120, the protruding edge 112 may mate with the indentation 122 and form a sealed micro chamber between the first chamber board 111 and the second chamber board 121. The semiconductor wafer may be housed or otherwise accommodated in the micro chamber for subsequent processing. When the first chamber portion 110 is in the open position relative to the second chamber portion 120, the protruding edge 112 is separated from the indentation 122, and the semiconductor wafer to be processed can be transferred in or out the micro chamber.

In this embodiment, when the first chamber portion 110 is in the closed position relative to the second chamber portion 120, the distance between the internal surface of the first chamber board 111 and the internal surface of the second chamber board 121, which means the height of the micro chamber matches the thickness of one semiconductor wafer 400; therefore, the semiconductor processing device 100 in this embodiment can only process one piece of semiconductor wafer 400 at a time.

The first chamber portion 110 comprises a first channel 113 formed on an internal surface of the first chamber portion 110 facing the micro chamber, and the second chamber portion 120 comprises a second channel 123 formed on an internal surface of the second chamber portion 120 facing the micro chamber. When the second chamber portion 120 is in the closed position relative to the first chamber portion 110 and the micro chamber contains a semiconductor wafer 400, the first channel 113 and the second channel 123 are connected and together form an edge micro-processing space 130, which accommodates the outer edge of the semiconductor wafer 400 in the micro chamber into the edge micro-processing space 130.

As illustrated in FIGS. 2a to 2c, in this embodiment, the first channel 113 and the second channel 123 are annular. When the second chamber portion 120 is in the closed position relative to the first chamber portion 110 and the semiconductor wafer 400 is housed in the micro chamber, the top internal side surface of the first channel 113 abuts on the first side surface of the semiconductor wafer 400, the top internal side surface of the second channel 123 abuts on the second side surface of the semiconductor wafer 400. The outer edge surface of the semiconductor wafer 400, the internal side surface of the first channel 113 and the internal side surface of the second channel 123 form a sealed, annular outer edge micro-processing space 130. The entire outer edge of semiconductor wafer 400 extends into the edge micro-processing space 130.

Therefore, in this embodiment, the edge micro-processing space 130 can realize targeted processing of the entire outer edge of the semiconductor wafer 400.

Of course, the first channel 113 and the second channel 123 may also be arranged as arc channels with radians less than 360 degrees. At this point, a sealed outer edge micro-processing space 130 with radians less than 360 degrees is formed between the first channel 113 and the second channel 123. Accordingly, part of the arc segment of the outer edge of the semiconductor wafer 400 extends outward into the edge micro-processing space 130. Therefore, the edge micro-processing space 130 only realizes the targeted processing of some certain arc segments of the outer edge of the semiconductor wafer 400.

The second chamber portion 120 has at least two edge processing through-holes passing through the second chamber portion 120 from the outside to communicate with the edge micro-processing space 130, wherein, at least one edge processing through-hole serves as a fluid inlet, and at least one edge processing through-hole is used as a fluid outlet. In this embodiment, two edge processing through-holes are provided, namely a first edge processing through-hole 124 used as a fluid inlet and a second edge processing through-hole 125 used as a fluid outlet. The edge micro-processing space 130 connects to the outside via the first edge processing through-hole 124 and the second edge processing through-hole 125.

In application, a processing fluid may enter the edge micro-processing space 130 via the first edge processing through-hole 124. The fluid that enters edge micro-processing space 130 can flow within the edge micro-processing space. At this point, the processing fluid can be in contact with and process the outer edge of the semiconductor wafer 400. The fluid that has been used to process the semiconductor wafer 400 can flow out via the second edge processing through-hole 125.

The process may be an etching process on the outer edge of the semiconductor wafer 400 to remove the thin layer of the outer edge of the semiconductor wafer 400, or it may be only a cleaning process for the outer edge of the semiconductor wafer 400 and so on.

Figure 1A:
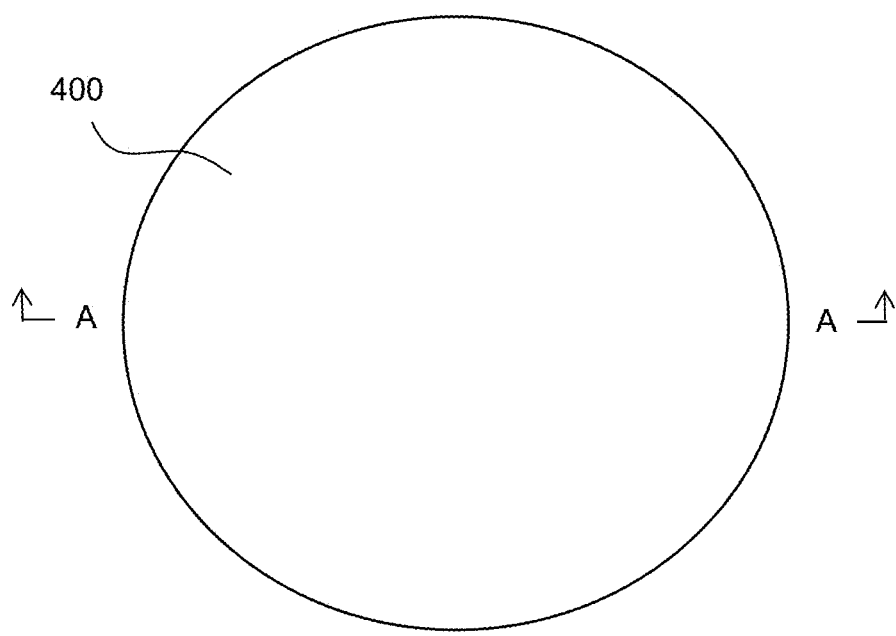
FIG. 1a is a schematic diagram of a semiconductor wafer.
Figure 1B:
Figure 1C:
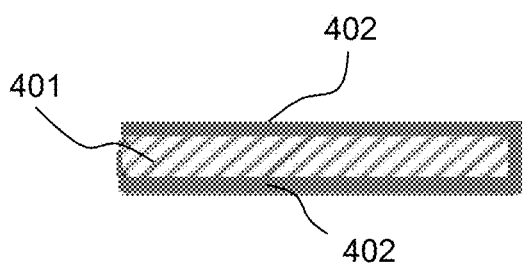
FIG. 1c is a sectional view of the outer edge of a semiconductor wafer before outer edge processing.
Figure 1D:
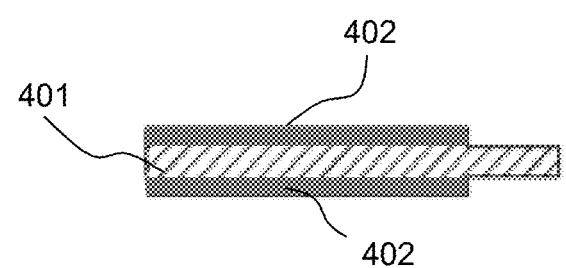
FIG. 1d is a sectional view of the outer edge of a semiconductor wafer after outer edge processing.

Take the etching process of the thin layer on the outer edge of the semiconductor wafer 400 for example. Refer to FIGS. 1a to 1d and FIGS. 2a to 2c, when the thin layers on the first side and the second side of the outer edge of the semiconductor wafer 400 need to be etched, a processing fluid that has etching effect on the thin layer may enter the edge micro-processing space 130 via the first edge processing through hole 124. When the fluid flows in the edge micro-processing space 130, the first side surface and the second side surface on the outer edge of the semiconductor wafer 400 would be contacted. As indicated by the arrow in FIG. 2c, the processing fluid is etching inward along the direction perpendicular to the first and second side surface of the semiconductor wafer 400, so that the thin layer 402 on the first and the second side surface of the outer edge of the semiconductor wafer 400 is continuously etched. As shown in FIG. 1d, after the processing, the thin layer 402 on the first and the second side surface of the outer edge of the semiconductor wafer 400 is etched, the first and second sides of the substrate layer 401 on the outer edge of the semiconductor wafer 400 are exposed. The processing fluid that has processed semiconductor wafer 400 continuously exiting via the second edge processing through-hole 125.

Based on the edge micro-processing space 130, the semiconductor processing device 100 in this embodiment only needs to consume a small amount of processing fluid to achieve targeted etching processing on the outer edge of the semiconductor wafer 400, which reduces the processing cost. In addition, compared with the dry process device in the existing technology, the semiconductor processing device 100 has the significant advantages of simple structure, convenient use and low operational skill requirements.

The semiconductor processing device 100 provided in this embodiment that can achieve targeted processing of the outer edge of one piece of semiconductor wafer 400.

In addition, the device is capable of accurately controlling a flowing speed of a processing fluid in the semiconductor wafer 400 to reduce the consumption of the processing fluid.

Continuing to refer to FIGS. 2a to 2c, the second chamber portion 120 comprises a recess formed on the internal surface of the second chamber portion 120 facing the micro chamber, the recess is located to the inner side of the second channel 123. When the second chamber portion 120 is in the closed position relative to the first chamber portion 110 and the semiconductor wafer 400 is housed in the micro chamber, the second side surface of the semiconductor wafer 400 covers the top of the recess to form an internal micro-processing space 140 located to the inner side of the edge micro-processing space 130.

Correspondingly, the second chamber portion 120 has at least two internal side processing through-holes passing through from the outside to communicate with the second chamber portion 120 and the internal micro-processing space 140, wherein, at least one internal side processing through-hole is used as a fluid inlet, and at least one internal side processing through-hole is used as a fluid outlet. This embodiment provided three internal side processing through-holes, respectively a first internal side processing through-hole 126 used as a fluid inlet and two second internal side processing through-holes 127 used as fluid outlets. The first internal side processing through-hole 126 is located at the center of the recess, and the two second internal side processing through-holes 127 are respectively located at the edge of the recess. The internal micro-processing space 140) communicates with the outside via the first internal side processing through-hole 126 and the second internal side processing through-holes 127.

A processing fluid may enter the internal micro-processing space 140 via the first internal surface processing through-hole 126. The fluid entering the internal micro-processing space 140 contacts and processes the top of the recess covering by the second side surface of the semiconductor wafer 400, and the fluid processed semiconductor wafer 400 continuously exiting via the second internal side processing through-holes 127.

It can be seen that the internal micro-processing space 140 in this embodiment can achieve targeted processing of a partial area of the second side surface of the semiconductor wafer 400. In this embodiment, only one recess is needed, which is approximately located in the middle of the internal surface of the second chamber portion 120. Therefore, the internal micro-processing space 140 is located in the middle of the second side surface of the semiconductor wafer 400.

In some other specific embodiments, according to specific processing needs, two or more of the recesses may be provided to form a corresponding number of internal micro-processing spaces 140, and each of the internal micro-processing spaces 140 corresponds to at least two internal side through-holes. The specific position and dimension of each recess can be adjusted according to the different needs to meet the targeted treatment of a plurality of regions on the second side surface of the semiconductor wafer 400.

The processing may be etching the thin layer on a specific area on the second side surface of the semiconductor wafer 400, or may be cleaning a specific area on the second side surface of the semiconductor wafer 400, etc.

The Second Embodiment

Figure 3A:
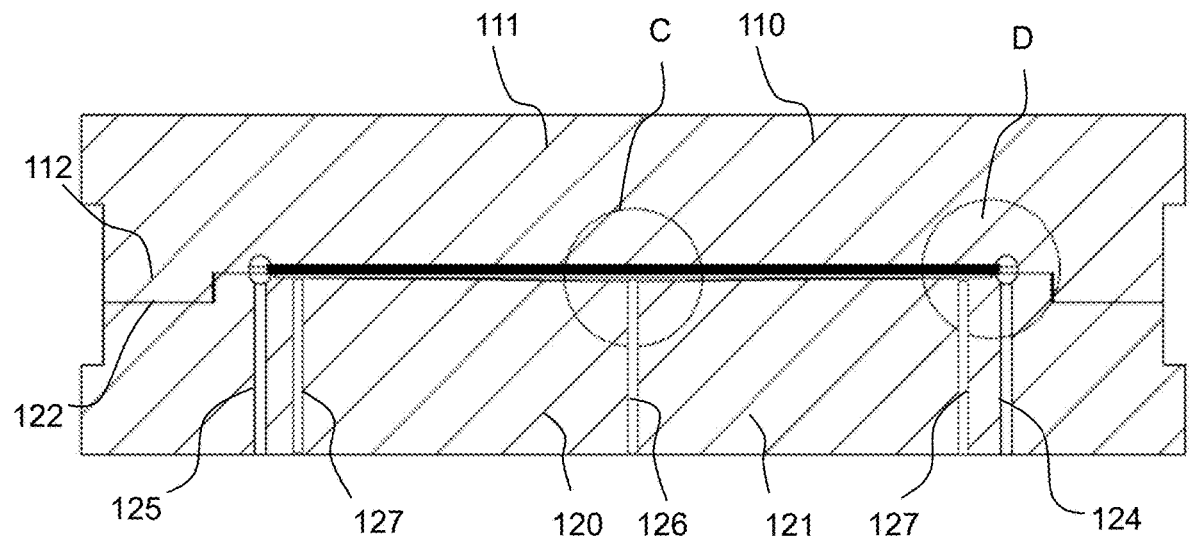
FIG. 3a is a sectional view of a semiconductor processing device according to the second embodiment of the present disclosure.
Figure 3B:
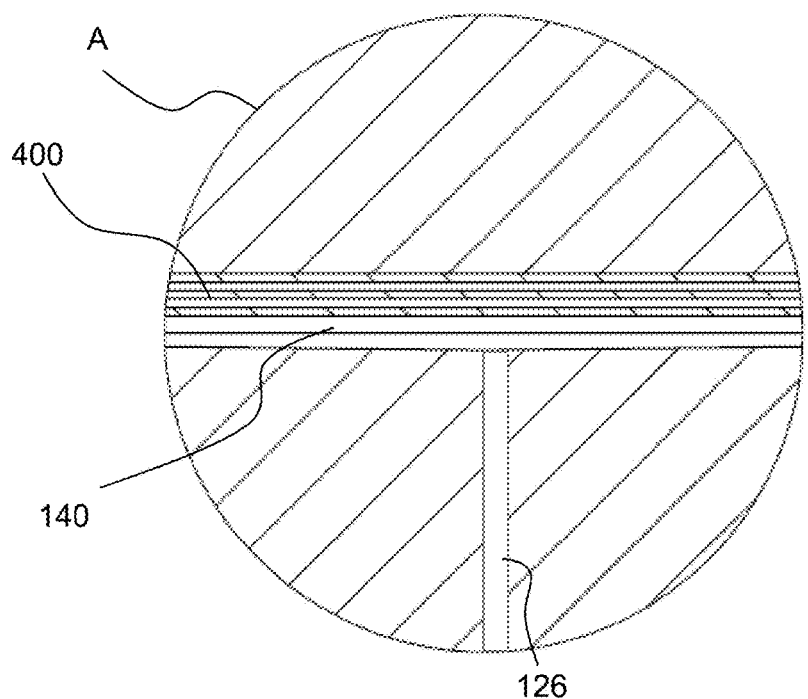
Figure 3C:
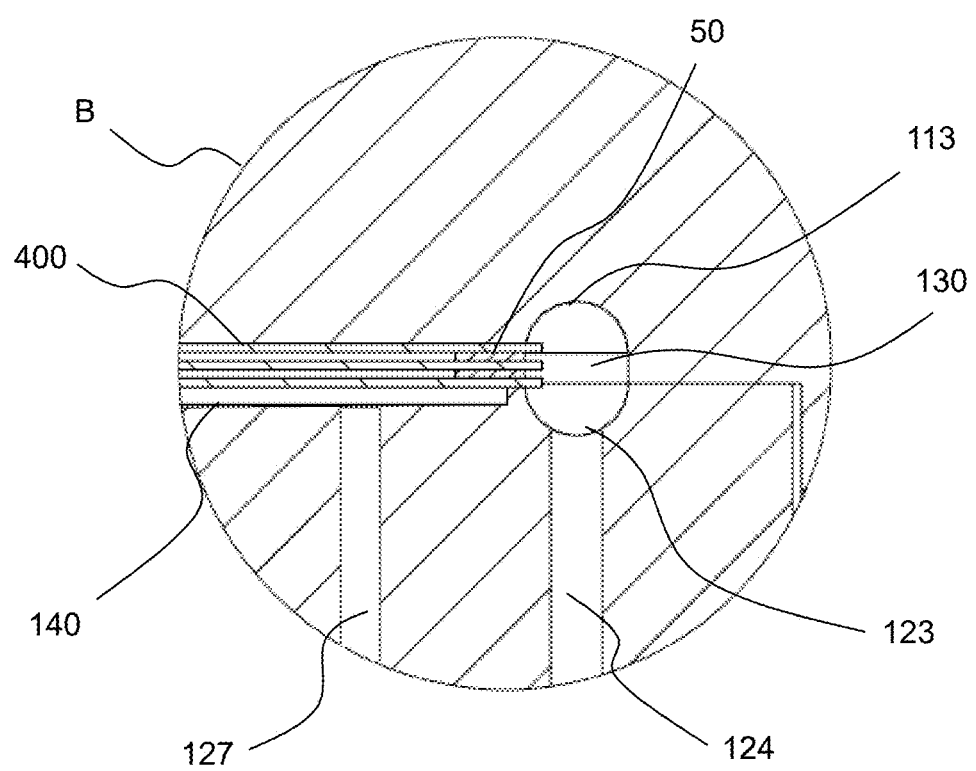

FIGS. 3a to 3c show schematic structural diagrams of a semiconductor processing device 200 according to the second embodiment of the present disclosure, in which, FIG. 3a is a schematic view of the semiconductor processing device 200; FIG. 3b illustrates a zoom-in view of circle C of FIG. 3a, and FIG. 3c illustrates a zoom-in view of circle D of FIG. 3a.

As shown in FIGS. 3a to 3c, the structure and process of the semiconductor processing device 200 according to in this embodiment are basically as same as the structure and process of the semiconductor processing device 100 according to the aforementioned first embodiment. The only difference is that the height of the micro chamber of the semiconductor processing device 200 is greater than the thickness of one stack semiconductor wafer 400, which can realize simultaneous processing of three stacked of semiconductor wafers 400.

For simplicity of description, this discourse only describes the differences between the semiconductor processing device 200 and the semiconductor processing device 100.

In this embodiment, in order to ensure that the first side surface and the second side surface of the outer edge of each semiconductor wafer 400 can be exposed in the edge micro-processing space 130, the semiconductor processing device 200 further includes a plurality of circular spacers 50, the diameter of which is smaller than the semiconductor wafers 400.

During the processing, a circular spacer 50 is arranged between two stack of semiconductor wafers 400, thus forming a gap between the outer edges of the semiconductor wafers 400 that matches the thickness of the circular spacer 50 so that, the processing fluid can smoothly enter the gap to achieve treatment of the first and second side surfaces of the outer edges of the semiconductor wafer 400.

In this embodiment, the height of the micro chamber matches the thickness of the three semiconductor wafers 400 and the two circular spacers 50 superimposed therein. Therefore, the semiconductor processing device 200 in this embodiment can realize the simultaneous processing of three semiconductor wafers 400.

As shown in FIG. 3c, in this embodiment, when the second chamber portion 120 is located in the closed position relative to the first chamber portion 110, and the semiconductor wafers 400 and the circular gaskets 50 are housed in the micro chamber, the outer edge of each semiconductor wafer 400, the outer end surface of each circular gasket 50, the internal side surface of the first channel 113, and the internal side surface of the second channel 123 combine to form a sealed, annular outer edge micro-processing space 400. Meanwhile, a part of the second side surface of the semiconductor wafer 400 in contact with the recess covers the top of the recess to form the internal micro processing space 140.

The height of the micro chamber of the semiconductor processing device 200 can also be adjusted, so that the semiconductor processing device 200 can simultaneously process two, four, or other semiconductor wafers 400. In order to improve the processing effect, during the processing, each of the semiconductor wafers 400 and each of the circular spacers 50 are concentrically accommodated in the micro chamber.

The Third Embodiment

The heights of the micro chambers of the semiconductor processing device in the above two embodiments are fixed, which cannot be flexibly adjusted. Therefore, the semiconductor processing devices in the above two embodiments can only process one number of semiconductor wafers at a time.

In order to improve the applicability of the semiconductor processing device so that it can satisfy the processing of different numbers of semiconductor wafers, it is necessary to further improve the structure of the semiconductor processing device.

Figure 4:
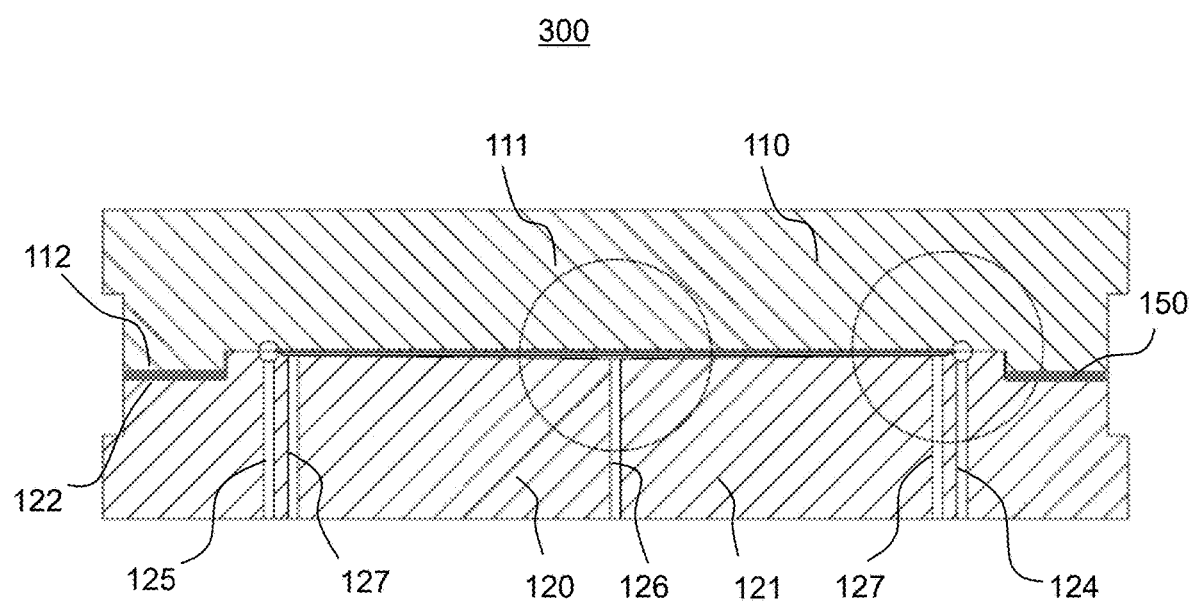
FIG. 4 is a sectional view of a semiconductor processing device according to the third embodiment of the present disclosure.

FIG. 4 is a sectional view of a semiconductor processing device 300 according to the third embodiment of the present disclosure. As shown in FIG. 4, the structure of the semiconductor processing device 300 provided in this embodiment is basically the same as the structure and working process of the semiconductor processing device 100 provided in the first embodiment and the semiconductor processing device 200 provided in the second embodiment. The only difference is that the semiconductor processing device 300 also includes a height adjustment mechanism, which can adjust the height of the micro chamber.

In this embodiment, the height adjustment mechanism comprises a detachable gasket 150 installed between the protruding edge 112 of the first chamber portion 110 and the indentation 122 of the second chamber portion 120. The detachable gasket 150 can be directly placed between the protruding edge 112 and the indentation 122 of the second chamber portion 120, or can be installed in a specific positioning structure in the protruding edge 112 or in the indentation 122, without special limitation.

In some other embodiments, other height adjustment mechanisms can also be used to adjust the height of the micro chamber.

In this embodiment, the height of the micro chamber can be adjusted to a predetermined height by selecting the detachable gasket 150 of different thicknesses, so as to satisfy the processing of a corresponding number of the semiconductor wafers 400.

In particular, the semiconductor processing device 300 in this embodiment may also choose not to install the detachable gasket 150. At this time, the initial height of the micro chamber matches the thickness of the semiconductor wafer 400. The semiconductor processing device 300 can process a piece of semiconductor wafer 400.

It should be noted that in other embodiments, the initial height of the micro chamber can also be matched with the stacking thickness of two, three, or other numbers of semiconductor wafers 400.

It can be seen that the height of the micro chamber of the semiconductor processing device 300 in this embodiment can be flexibly adjusted to meet the requirements for processing different numbers of semiconductor wafers, which greatly improves the applicability of the semiconductor processing device.

The Fourth Embodiment

Figure 5A:
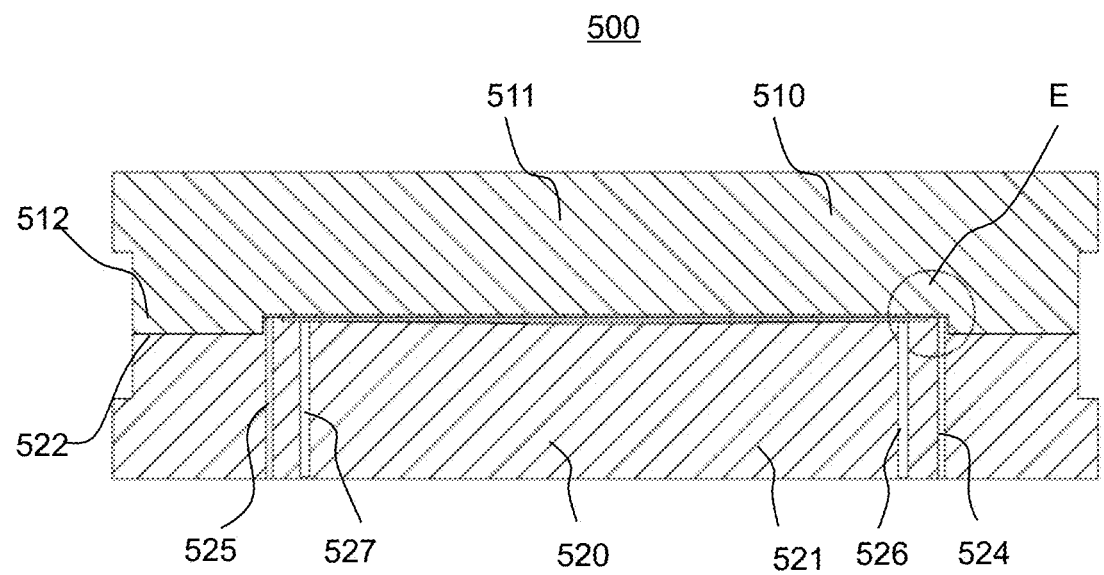
FIG. 5a is a sectional view of a semiconductor processing device according to the fourth embodiment of the present disclosure.
Figure 5B:
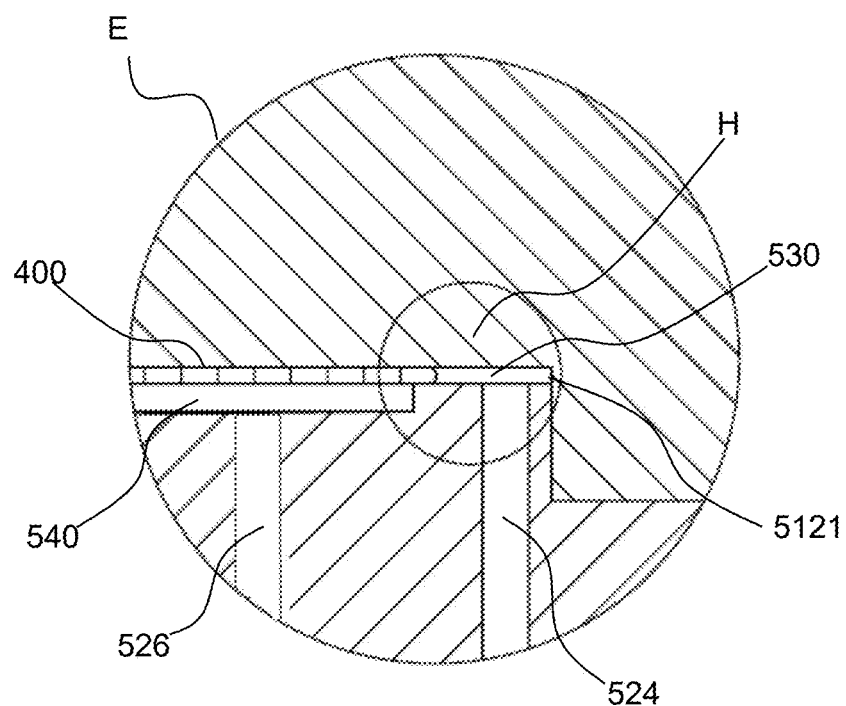
Figure 5C:
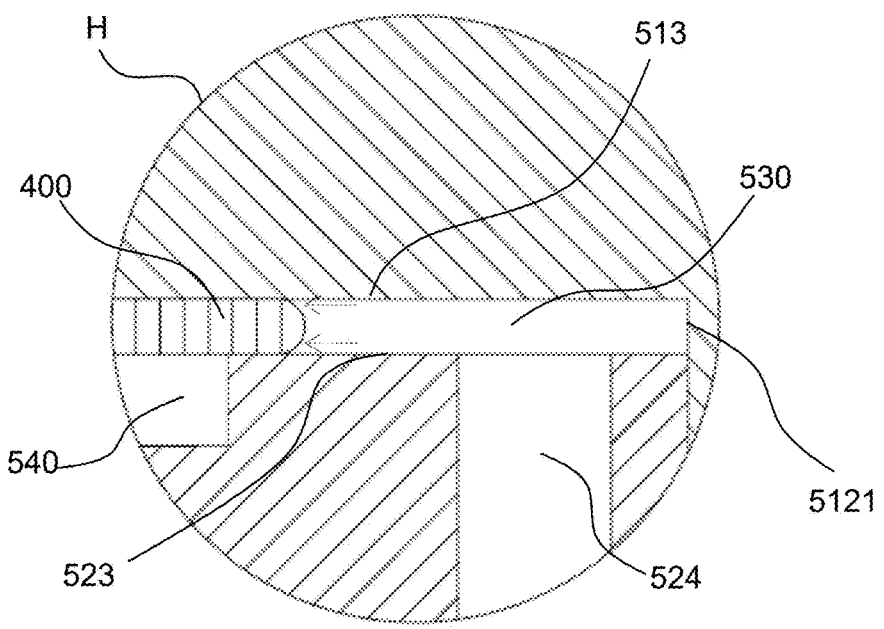
FIG. 5c illustrates a zoom-in view of circle H of FIG. 5b.

FIG. 5a to 5c are schematic diagrams of a semiconductor processing device 500) according to the fourth embodiment of the present disclosure, in which: FIG. 5a is a sectional view of a semiconductor processing device 500: FIG. 5b illustrates a zoom-in view of circle E of FIG. 5a; FIG. 5c illustrates a zoom-in view of circle H of FIG. 5b.

As illustrated in FIGS. 5a to 5c, the semiconductor processing device 500 includes a first chamber portion 510 and a second chamber portion 520. The first chamber portion 510 includes a first chamber board 511 and a protruding edge 512 that extends downward from a circumferential region of the first chamber board 511. The second chamber portion 520 may include a second chamber board 521 and an indentation 522 that indents downward at a circumferential region of the second chamber board 521.

The first chamber portion 510 may be movable relative to the second chamber portion 520 between an open position and a closed position. When the first chamber portion 510 is in the closed position relative to the second chamber portion 520, the protruding edge 512 may mate with the indentation 522 and form a sealed micro chamber between the first chamber board 511 and the second chamber board 521. The semiconductor wafer may be housed or otherwise accommodated in the micro chamber for subsequent processing. When the first chamber portion 510 is in the open position relative to the second chamber portion 520, the protruding edge 512 is separated from the indentation 522, and the semiconductor wafer to be processed can be transferred in or out the micro chamber.

The first chamber portion 510 has an internal side surface 513 facing the micro chamber, and the second chamber portion 520 has an internal side surface 523 facing the micro chamber.

In this embodiment, when the first chamber portion 510) is in the closed position relative to the second chamber portion 520, the distance between the internal surface of the first chamber board 511 and the internal surface of the second chamber board 521, which means the height of the micro chamber matches the thickness of one semiconductor wafer 400; therefore, the semiconductor processing device 500 in this embodiment can only process one piece of semiconductor wafer 400 at a time.

As shown in FIG. 5c, when the second chamber portion 520 is in the closed position relative to the first chamber portion 510 and the semiconductor wafer 400 is housed in the micro chamber, the internal side surface 513 of the first chamber portion 510 abuts on the edge portion of the first side surface of the to-be-processed semiconductor wafer 400, while the internal side surface 523 of the second chamber portion 520 abuts on the edge portion of the second side surface of the semiconductor wafer 400. Thus, the outer edge surface of the to-be-processed semiconductor wafer 400, the outer edge of the internal side surface 513 of the first chamber portion 510, the upper edge surface of the internal surface 5121 of the first protruding edge 512 and the outer edge part of the internal side surface 523 of the second chamber portion 520 are enclosed into sealed, annular outer edge surface micro-processing space 530.

The outer edge surface of the semiconductor wafer 400 is all exposed to the outer edge surface micro-processing space 530. When the outer edge surface micro-processing space 530 is filled with or has part of the processing fluid, the processing fluid can achieve targeted processing of the outer edge surface of the semiconductor wafer 400.

The second chamber portion 520 has at least two outer edge processing through-holes passing through the second chamber portion 520 from the outside to communicate with the outer edge micro-processing space 530, wherein: at least one outer edge processing through-hole serves as a fluid inlet, and at least one outer edge processing through-hole is used as a fluid outlet. In this embodiment, two outer edge processing through-holes are provided, namely a first outer edge processing through-hole 524 used as a fluid inlet and a second outer edge processing through-hole 525 used as a fluid outlet. The outer edge micro-processing space 530) communicates with the outside through the first outer edge processing through-hole 524 and the second outer edge processing through-hole 525.

A processing fluid may enter the outer edge micro-processing space 530 via the first outer edge processing through-hole 524. When the fluid flows in the outer edge micro-processing space 530, the outer edge of the semiconductor wafer 400 would be connected and processed, and the processing fluid that has processed semiconductor wafer 400 continuously exiting via the second outer edge processing through-hole 525.

The process may be an etching process on the outer edge of the semiconductor wafer 400 to remove the thin layer of the outer edge of the semiconductor wafer 400, or it may be only a cleaning process for the outer edge of the semiconductor wafer 400 and so on.

Take the etching process of the thin layer on the outer edge of the semiconductor wafer 400 for example. Refer to FIGS. 1a to 1d and FIGS. 5a to 5c, when the thin layers on the first side and the second side of the outer edge of the semiconductor wafer 400 need to be etched, a processing fluid that has etching effect on the thin layer may enter the edge micro-processing space 530 via the first outer edge processing through-hole 524. When the fluid flows in the outer edge micro-processing space 530, the first side surface and the second side surface on the outer edge of the semiconductor wafer 400 would be contacted. As indicated by the arrow in FIG. 5c, the processing fluid is etching inward along the direction perpendicular to the first and second side surface of the semiconductor wafer 400, so that the thin layer 402 on the first side and the second side surface of the outer edge of the semiconductor wafer 400 is continuously etched. As shown in FIG. 1d, after the processing, the thin layer 402 on the first side surface and the second side surface of the outer edge of the semiconductor wafer 400 is etched, the first and second sides of the substrate layer 401 on the outer edge of the semiconductor wafer 400 are exposed. The processing fluid that has processed semiconductor wafer 400 continuously exiting via the second outer edge processing through-hole 525.

Based on the outer edge micro-processing space 530, the semiconductor processing device 500 in this embodiment only needs to consume a small amount of processing fluid to achieve targeted etching processing on the outer edge of the semiconductor wafer 400, which reduces the processing cost. In addition, compared with the dry process device in the existing technology, the semiconductor processing device 500 has the significant advantages of simple structure, convenient use and low operational skill requirements.

Continuing to refer to FIGS. 5a to 5c, the second chamber portion 520 comprises a recess formed on the internal surface 524 of the second chamber portion 520 facing the micro chamber. When the second chamber portion 520 is in the closed position relative to the first chamber portion 510 and the semiconductor wafer 400 is housed in the micro chamber, the second side surface of the semiconductor wafer 400 covers the top of the recess to form an internal micro-processing space 540 located to the inner side of the edge micro-processing space 530.

Correspondingly, the second chamber portion 520 has at least two internal side processing through-holes passing through from the outside to communicate with the second chamber portion 520 and the internal micro-processing space 540, wherein: at least one internal side processing through-hole is used as a fluid inlet, and at least one internal side processing through-hole is used as a fluid outlet. This embodiment provided two internal side processing through-holes, respectively a first internal side processing through-hole 526 used as a fluid inlet and a second internal side processing through-holes 527 used as fluid outlets. The internal micro-processing space 540 communicates with the outside through the first internal surface processing through-hole 526 and the second internal surface processing through-holes 527.

A processing fluid may enter the internal micro-processing space 540 via the first internal surface processing through-hole 526. The fluid entering the internal micro-processing space 540) contacts and processes the top of the recess covering by the second side surface of the semiconductor wafer 400, and the fluid processed semiconductor wafer 400 continuously exiting via the second internal side processing through-holes 527.

It can be seen that the internal micro-processing space 540 in this embodiment can achieve targeted processing of a partial area of the second side surface of the semiconductor wafer 400. In this embodiment, only one recess is needed, which is approximately located in the middle of the internal side surface 523 of the second chamber portion 520. Therefore, the internal micro-processing space 540) is located in the middle of the second side surface of the semiconductor wafer 400.

In some other specific embodiments, according to specific processing needs, two or more the recesses may be provided to form a corresponding number of internal micro-processing spaces 540), and each of the internal micro-processing spaces 540) corresponds to at least two internal side through-holes. The specific position and dimension of each recess can be adjusted according to the different needs to meet the targeted treatment of a plurality of regions on the second side surface of the semiconductor wafer 400.

The processing may be etching the thin layer on a specific area on the second side surface of the semiconductor wafer 400, or may be cleaning a specific area on the second side surface of the semiconductor wafer 400, etc.

The Fifth Embodiment

Figure 6A:
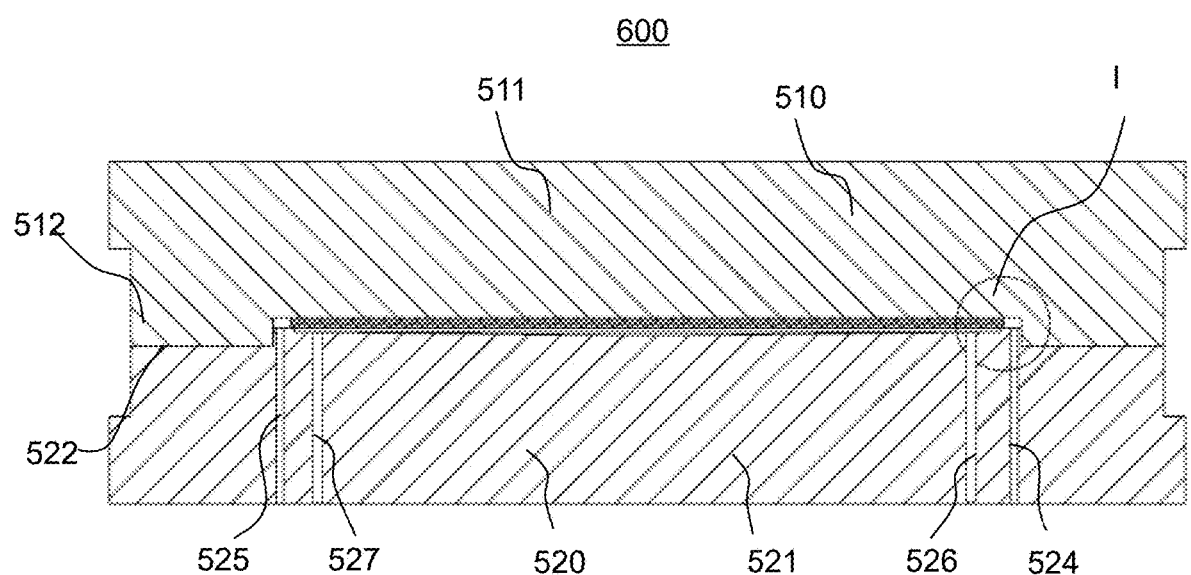
FIG. 6a is a sectional view of a semiconductor processing device according to the fifth embodiment of the present disclosure.
Figure 6B:
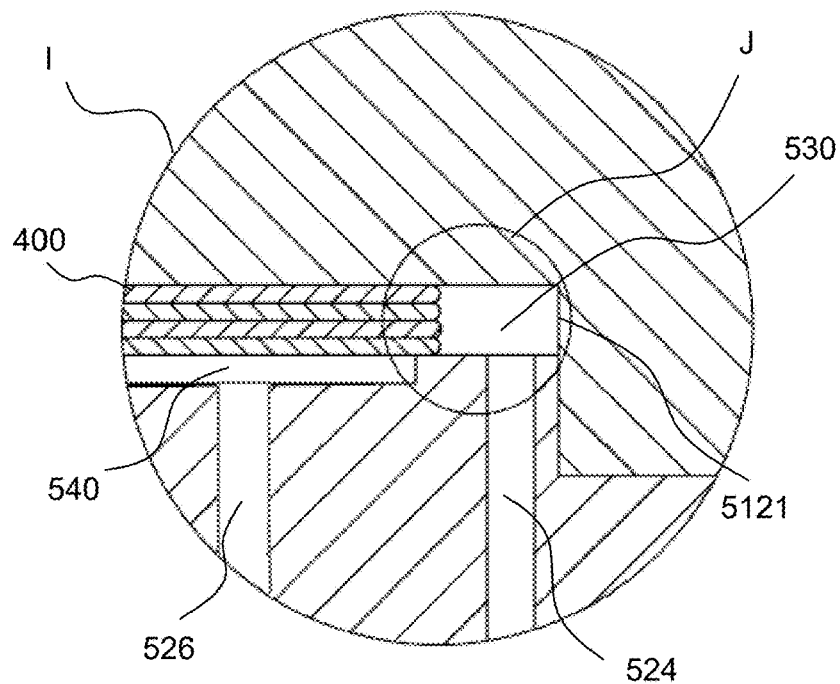
Figure 6C:
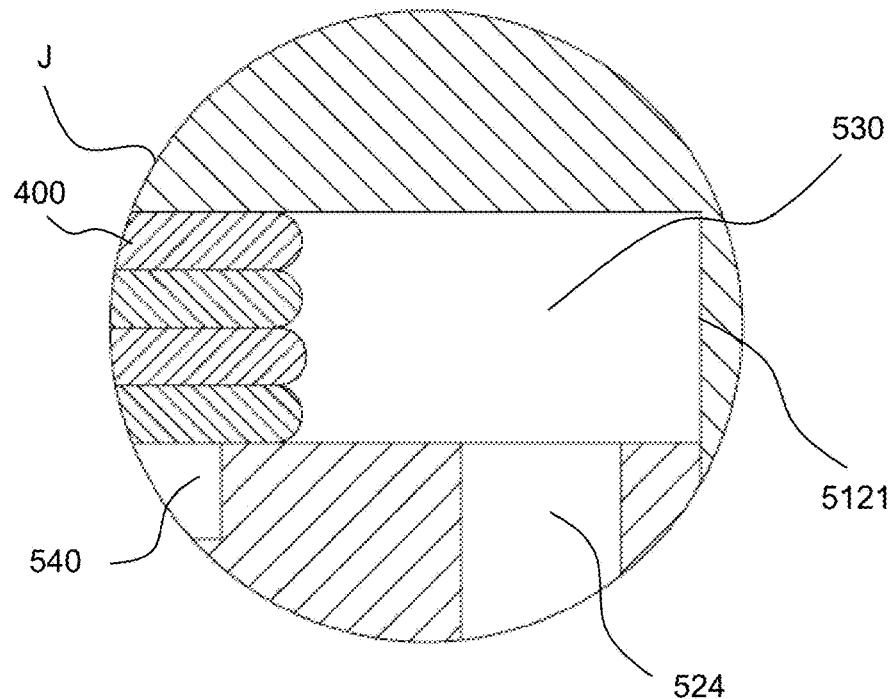
FIG. 6c illustrates a zoom-in view of circle J of FIG. 6b.

FIGS. 6a to 6c show schematic structural diagrams of a semiconductor processing device 600 according to the fifth embodiment of the present disclosure, in which: FIG. 6a is a schematic view of the semiconductor processing device 600; FIG. 6b illustrates a zoom-in view of circle I of FIG. 6a, and FIG. 6c illustrates a zoom-in view of circle J of FIG. 6b.

As shown in FIGS. 6a to 6c, the structure and process of the semiconductor processing device 600 according to in this embodiment are basically as same as the structure and process of the semiconductor processing device 500 according to the aforementioned fourth embodiment. The only difference is that the height of the micro chamber of the semiconductor processing device 600 matches the thickness of four stacked of semiconductor wafers 400 to realize simultaneous processing of four stacked of semiconductor wafers 400.

For simplicity of description, this specification only describes the differences between the semiconductor processing device 600 and the semiconductor processing device 500.

As shown in FIG. 6c, when the first chamber portion 510 is in the closed position relative to the second chamber portion 520 and the four semiconductor wafers 400 are stacked and housed in the micro chamber, the outer edge surface of the four semiconductor wafers 400, the outer edge of the internal side surface 513 of the first chamber portion 510, the upper edge surface of the internal surface 5121 of the first protruding edge 512 and the outer edge part of the internal side surface 523 of the second chamber portion 520 are enclosed into a sealed, annular outer edge surface micro-processing space 530. In the meanwhile, the part of the second side surface of the semiconductor wafers 400 that is in contact with the recess covers the top of the recess to form an internal micro-processing space 540.

The height of the micro chamber of the semiconductor processing device 600 can also be adjusted to match the thickness of two, three, or other semiconductor wafers 400, so that the semiconductor processing device 600 simultaneously process two, three, or other semiconductor wafers 400. In order to improve the processing effect, during the processing, the semiconductor wafers 400 are concentrically accommodated in the micro chamber so that the outer end surfaces of the semiconductor wafers 400 are kept flush.

It can be seen that in the semiconductor processing device 600 according to this embodiment, the outer edge surface micro-processing space 530 can achieve targeted processing of the outer edge surfaces of more than two pieces of semiconductor wafers 400 at one time. Meanwhile, the internal micro-processing space 540 can achieve targeted processing of a specific area of the second side surface of the semiconductor wafer 400 that is in contact with the recess.

The Sixth Embodiment

The heights of the micro chambers of the semiconductor processing device in the above two embodiments are fixed, which cannot be flexibly adjusted. Therefore, the semiconductor processing devices in the above two embodiments can only process a certain number of semiconductor wafers at a time.

In order to improve the applicability of the semiconductor processing device to satisfy the processing of different numbers of semiconductor wafers, it is necessary to further improve the structure of the semiconductor processing device.

Figure 7:
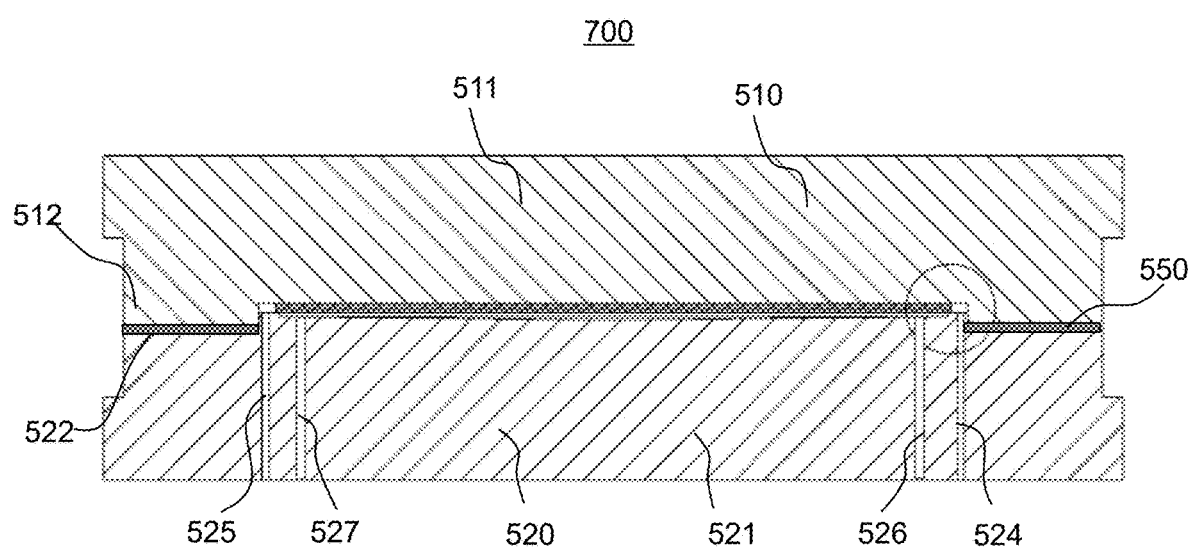
FIG. 7 is a sectional view of a semiconductor processing device according to the sixth embodiment of the present disclosure.

FIG. 7 is a sectional view of a semiconductor processing device 700 according to the sixth embodiment of the present disclosure. As shown in FIG. 7, the structure of the semiconductor processing device 700 according to in this embodiment is basically the same as the structure and working process of the semiconductor processing device 500 according to in the fourth embodiment and the semiconductor processing device 600 according to in the fifth embodiment. The only difference is that the semiconductor processing device 700 also includes a height adjustment mechanism, which can adjust the height of the micro chamber.

In this embodiment, the height adjustment mechanism comprises a detachable gasket 550 installed between the protruding edge 512 of the first chamber portion 510 and the indentation 522 of the second chamber portion 520. The detachable gasket 550 can be directly placed between the protruding edge 512 and the indentation 522, or can be installed in a specific positioning structure in the protruding edge 512 or in the indentation 522, without special limitation. In some other embodiments, other height adjustment mechanisms can also be used to adjust the height of the micro chamber.

In this embodiment, the height of the micro chamber can be adjusted to a predetermined height by selecting the detachable gasket 550 of different thicknesses, so as to satisfy the processing of a corresponding number of the semiconductor wafers 400.

In particular, the semiconductor processing device 700 in this embodiment may also choose not to install the detachable gasket 550. At this time, the initial height of the micro chamber matches the thickness of the semiconductor wafer 400. The semiconductor processing device 700 can process a piece of semiconductor wafer 400.

If it is necessary to process two stacked of semiconductor wafers 400 at one time, a detachable gasket 550 with a thickness matching the thickness of one semiconductor wafer 400 can be installed between the protruding edge 512 of the first chamber portion 510 and the indentation 522 of the second chamber portion 520. Similarly, if it is necessary to process other numbers of semiconductor wafers 400 at one time, the detachable gasket 550 with corresponding thickness can be installed between the protruding edge 512 of the first chamber portion 510 and the indentation 522 of the second chamber portion 520.

It should be noted that in other embodiments, the initial height of the micro chamber can also be matched with the stacking thickness of two, three, or other numbers of semiconductor wafers 400.

It can be seen that the height of the micro chamber of the semiconductor processing device 700 in this embodiment can be flexibly adjusted to meet the requirements for processing different numbers of semiconductor wafers, which greatly improves the applicability of the semiconductor processing device.

The present disclosure has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the present disclosure as claimed. Accordingly, the scope of the present disclosure is defined by the appended claims rather than the foregoing description of embodiments.

The invention claimed is:

1. A semiconductor processing system, comprising:
a first chamber portion; and
a second chamber portion movable relative to the first chamber portion between an open position and a closed position, wherein when the second chamber portion is in the closed position relative to the first chamber portion, a micro chamber is formed between the first chamber portion and the second chamber portion and a semiconductor wafer is capable of being accommodated in the micro chamber, and when the second chamber portion is in the open position relative to the first chamber portion, the semiconductor wafer is capable of being transferred into or out of the micro chamber,
wherein the first chamber portion comprises an annular first channel formed on an internal surface of the first chamber portion facing the micro chamber, and the second chamber portion comprises an annular second channel being formed on an internal surface of the second chamber portion facing the micro chamber and the annular second channel being aligned with the annular first channel, when the second chamber portion is in the closed position relative to the first chamber portion and the micro chamber accommodates the semiconductor wafer, the annular first channel and the annular second channel are connected and together form an annular edge micro-processing space, and at least a portion of a first side surface, a second side surface and an entire outer edge of the semiconductor wafer is accommodated in the micro chamber, extends into and exposed to the edge micro-processing space, wherein the edge micro-processing space is sealed and connected to outside of the edge micro-processing space via multiple edge processing through-holes such that one or more of the edge processing through-holes serve as fluid inlets, extending through said second chamber to provide processing fluid to the outer edge of the semiconductor wafer for a targeted processing directed at the outer edge of the semiconductor wafer, and one or more of the other of the edge processing through-holes serve as fluid outlets, extending through said second chamber to remove processing fluid.

2. The semiconductor processing system according to claim 1, wherein:
a top internal surface of the first channel abuts on a first side surface of the semiconductor wafer close to the first chamber portion, and a top internal surface of the second channel abuts on a second side surface of the semiconductor wafer close to the second chamber portion.

3. The semiconductor processing system according to claim 1, wherein:
the second chamber portion comprises one or more recesses formed on the internal surface of the second chamber portion facing the micro chamber, the one or more recesses are located to the inner side of the second channel;
when the second chamber portion is in the closed position relative to the first chamber portion and the semiconductor wafer is housed in the micro chamber, the side surface of the semiconductor wafer close to the second chamber portion covers the top of the one or more recesses to form one or more internal micro-processing spaces being connected to the outside via internal processing through-holes, and fluid flows in or out of each internal micro-processing space through the internal processing through-holes.

4. The semiconductor processing system according to claim 3, wherein:
one or more of the internal processing through-holes are used as fluid inlets, and one or more of the other internal processing through holes are used as fluid outlets, and the internal micro-processing space is connected to the outside the internal processing through-holes.

* * * * *